US011239182B2

United States Patent
Korneisel et al.

(10) Patent No.: US 11,239,182 B2
(45) Date of Patent: Feb. 1, 2022

(54) CONTROLLED INDUCED WARPING OF ELECTRONIC SUBSTRATES

(71) Applicant: Rockwell Collins, Inc., Cedar Rapids, IA (US)

(72) Inventors: Richard Korneisel, Cedar Rapids, IA (US); Nathaniel P. Wyckoff, Marion, IA (US); Brandon C. Hamilton, Marion, IA (US); Jacob R. Mauermann, Marion, IA (US); Carlen R. Welty, Solon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/750,382

(22) Filed: Jan. 23, 2020

(65) Prior Publication Data

US 2021/0233866 A1 Jul. 29, 2021

(51) Int. Cl.
*H01L 23/00* (2006.01)
*H01L 21/3205* (2006.01)

(52) U.S. Cl.
CPC ...... *H01L 23/562* (2013.01); *H01L 21/32051* (2013.01)

(58) Field of Classification Search
None
See application file for complete search history.

(56) References Cited

U.S. PATENT DOCUMENTS

| | | | |
|---|---|---|---|
| 6,507,100 B1 | 1/2003 | Valluri et al. | |
| 6,953,754 B2 | 10/2005 | Machida et al. | |
| 9,048,298 B1 | 6/2015 | Huemoeller et al. | |
| 9,865,521 B2 | 1/2018 | Jha et al. | |
| 10,134,689 B1 | 11/2018 | Sridharan et al. | |
| 10,381,288 B2 | 8/2019 | Hu | |
| 10,595,399 B2 | 3/2020 | Hada et al. | |
| 2001/0045643 A1* | 11/2001 | Katoh | H01L 23/34 257/706 |
| 2004/0188817 A1 | 9/2004 | Hua et al. | |
| 2010/0109169 A1 | 5/2010 | Kolan et al. | |
| 2015/0115393 A1 | 4/2015 | Shen | |
| 2015/0155242 A1 | 6/2015 | Li et al. | |
| 2018/0082960 A1 | 3/2018 | Bellotti et al. | |
| 2018/0114705 A1* | 4/2018 | Lin | H01L 21/565 |
| 2019/0206753 A1 | 7/2019 | Gaines et al. | |

(Continued)

OTHER PUBLICATIONS

Abadias, G. et al., "Stress in thin films and coatings: Current status, challenges and prospects", Mar. 5, 2018, 147 pages.

(Continued)

*Primary Examiner* — Bo B Jang
(74) *Attorney, Agent, or Firm* — Suiter Swantz pc llo

(57) ABSTRACT

An integrated circuit (IC) package incorporating controlled induced warping is disclosed. The IC package includes an electronic substrate having an active side upon which semiconducting dies and functional circuits have been lithographed or otherwise fabricated, leading to an inherent warping in the direction of the active side. One or more corrective layers may be deposited to the opposing, or inactive, side of the semiconducting die via thin film deposition (TFD) instrumentation and techniques in order to induce corrective warping of the electronic substrate back toward the horizontal (e.g., in the direction of the inactive side) to a desired degree.

12 Claims, 4 Drawing Sheets

(56) References Cited

U.S. PATENT DOCUMENTS

2019/0244914 A1 8/2019 Chen et al.
2020/0066655 A1 2/2020 Eid et al.
2020/0091090 A1 3/2020 Chen et al.

OTHER PUBLICATIONS

Knotek, O. et al., "On the origin of compressive stress in PVD coatings—an explicative model", Surface and Coatings Technology, 46 (1991), pp. 265-274.
Oettel, H. et al., "Residual stresses in PVD hard coatings", Surface and Coatings Technology, 76-77 (1995), pp. 265-273.
Extended Search Report for European Application No. 21153263.5 dated Jun. 18, 2021, 8 pages.

* cited by examiner

CONTROLLED INDUCED WARPING OF ELECTRONIC SUBSTRATES

TECHNICAL FIELD

The subject matter disclosed herein is directed generally to electronic circuitry and more particularly to semiconducting dies upon which functional circuits are fabricated.

BACKGROUND

Integrated circuit (IC) packages are small blocks of semiconducting material upon which semiconducting dies and/or functional circuits are fabricated, e.g., via lithography, additive manufacturing, etc. For example, when a functional circuit is built on the active side of the package, remnant internal stresses will be induced in the substrate causing warping in the direction of the active layer. Warping of up to 25% of the package thickness has been observed. Warping in the package or its components may lead to further manufacturability issues, e.g., during lithography or spin-on operations. Additionally, warped packages integrated into end products may experience opens, head-on-pillow defects, and other die interconnect issues which may lead to electrical failures. Finally, package warping may complicate or prevent z-height miniaturization efforts by requiring mechanical designs to accommodate the warping. There is currently no method for addressing these challenges via the flattening of warped packages.

SUMMARY

An integrated circuit (IC) package is disclosed. In embodiments, the IC package includes one or more electronic substrate layers having an active side (e.g., face) and an inactive side opposite the active side, one or more semiconducting dies and/or functional circuitry fabricated on the active side. The IC package is subject to a degree of inherent warping toward the active side, the warping associated with the fabrication of the die and functional circuitry. To induce a desired degree of counter-warping of the electronic substrates toward the inactive side, the inactive side (e.g., face) may have one or more corrective layers deposited thereon via thin film deposition (TFD) instrumentation and techniques.

A method for induced warping of an IC package or its components is also disclosed. In embodiments, the method includes determining a degree of inherent warping toward an active side of an electronic substrate of the IC package, the inherent warping associated with the fabrication of semiconducting die/s and functional circuitry upon the active side. The method includes determining a degree of desired induced warping stress (e.g., counter-warping) toward an inactive side of the electronic substrate, the inactive side opposite the active side. The method includes implementing the desired induced warping stress by applying, via thin film deposition (TFD), at least one corrective layer to the inactive side.

This Summary is provided solely as an introduction to subject matter that is fully described in the Detailed Description and Drawings. The Summary should not be considered to describe essential features nor be used to determine the scope of the Claims. Moreover, it is to be understood that both the foregoing Summary and the following Detailed Description are example and explanatory only and are not necessarily restrictive of the subject matter claimed.

BRIEF DESCRIPTION OF THE DRAWINGS

The detailed description is described with reference to the accompanying figures. The use of the same reference numbers in different instances in the description and the figures may indicate similar or identical items. Various embodiments or examples ("examples") of the present disclosure are disclosed in the following detailed description and the accompanying drawings. The drawings are not necessarily to scale. In general, operations of disclosed processes may be performed in an arbitrary order, unless otherwise provided in the claims. In the drawings:

DETAILED DESCRIPTION

Figure 1:
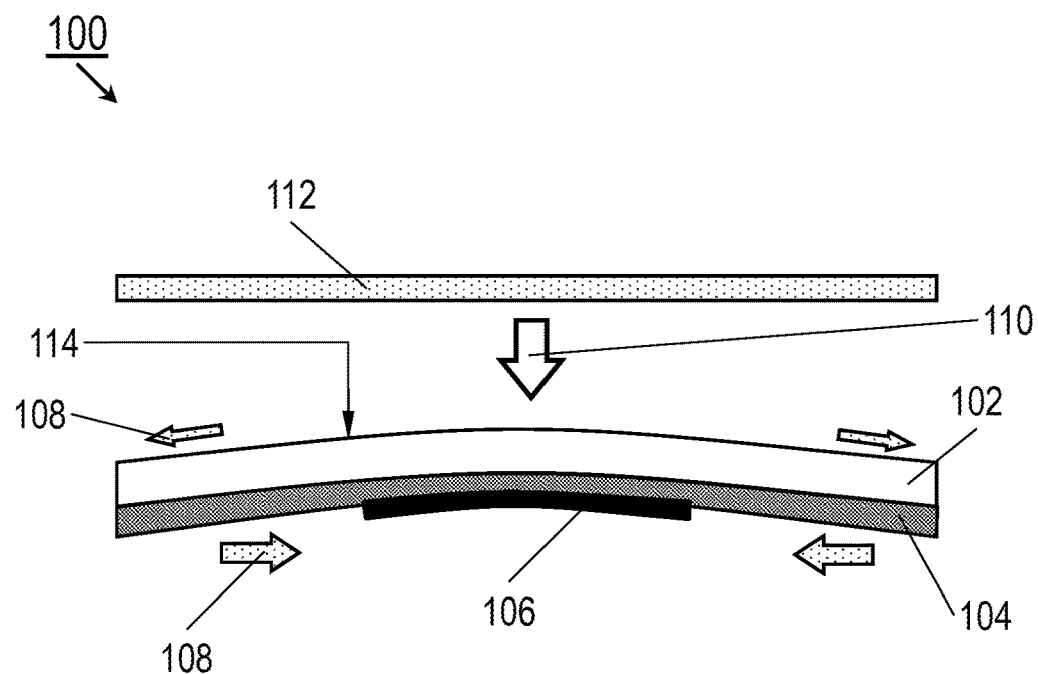
FIG. 1 is a diagrammatic cross section illustrating an integrated circuit (IC) package in accordance with example embodiments of this disclosure.

Before explaining one or more embodiments of the disclosure in detail, it is to be understood that the embodiments are not limited in their application to the details of construction and the arrangement of the components or steps or methodologies set forth in the following description or illustrated in the drawings. In the following detailed description of embodiments, numerous specific details may be set forth in order to provide a more thorough understanding of the disclosure. However, it will be apparent to one of ordinary skill in the art having the benefit of the instant disclosure that the embodiments disclosed herein may be practiced without some of these specific details. In other instances, well-known features may not be described in detail to avoid unnecessarily complicating the instant disclosure.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only and should not be construed to limit the disclosure in any way unless expressly stated to the contrary.

Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of "a" or "an" may be employed to describe elements and components of embodiments disclosed herein. This is done merely for convenience and "a" and "an" are intended to include "one" or "at least one," and the singular also includes the plural unless it is obvious that it is meant otherwise.

Finally, as used herein any reference to "one embodiment" or "some embodiments" means that a particular element, feature, structure, or characteristic described in connection with the embodiment is included in at least one embodiment disclosed herein. The appearances of the phrase "in some embodiments" in various places in the specification are not necessarily all referring to the same embodiment, and embodiments may include one or more of the features expressly described or inherently present herein, or any combination or sub-combination of two or more such features, along with any other features which may not necessarily be expressly described or inherently present in the instant disclosure.

Referring to FIG. 1, an integrated circuit (IC) package 100 is disclosed. The semiconducting die 100 may include electronic substrates 102 and an active layer 104 upon which one or more semiconducting dies 106 and/or additional functional circuitry may be fabricated.

In embodiments, the electronic substrates 102 may be fashioned of silicon or any other appropriate semiconducting material. The active layer 104 may include, for example, additive layers or other functional circuitry fabricated upon the electronic substrates 102 (e.g., onto an active side of the electronic substrate) or upon any additive layers deposited thereon, resulting in an inherent warping 108 toward the active layer (e.g., due to internal compressive stressed within the active layer). An induced warping stress may be imparted to the IC package 100 by utilizing thin film deposition (TFD) instrumentation to deposit (110) or bond one or more corrective layers 112 on the inactive side (114) of the electronic substrates 102 (e.g., the side opposite the active layer/active side 104). As the corrective layers 112 are applied to the inactive side 114 of the electronic substrates 102 (e.g., and condense thereon as thin films), the functionality of the active layer 104 is unaffected. For example, depending on the desired degree of induced warping (and, e.g., the corresponding amount of compressive or tensile stress to induce within the active layer 104), the corrective layers 112 may be deposited via physical vapor deposition (PVD), sputtering deposition, electroplating, or any other like instrumentation and process.

Figure 2:
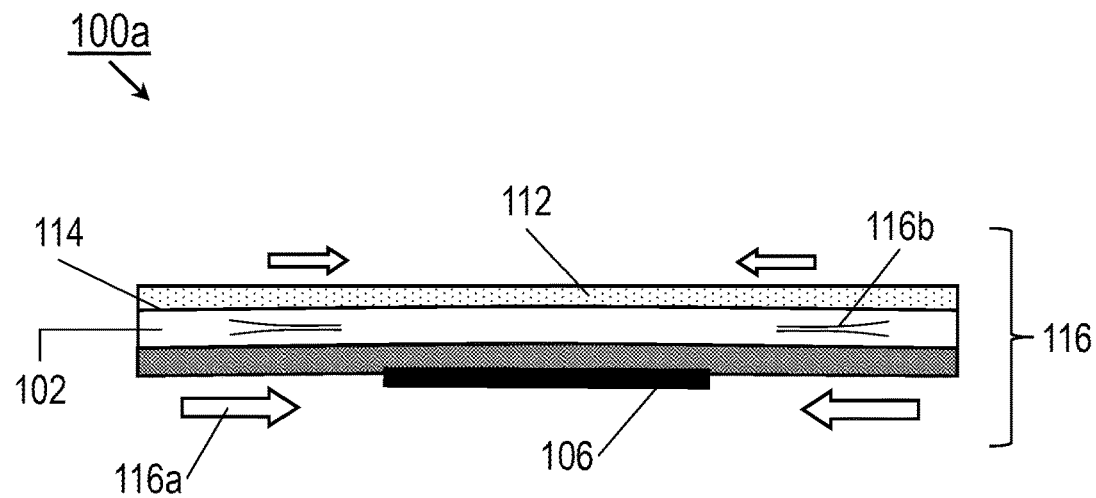
FIG. 2 is a diagrammatic cross section illustrating the IC package of FIG. 1.

Referring also to FIG. 2, the IC package 100a may be implemented and may function similarly to the IC package 100 of FIG. 1, except that residual stresses within the corrective layers 112 bonded to the inactive side 114 may induce compressive stresses (116a) and/or tensile stresses (116b) contributing to correctively warp (116) the electronic substrates 102 of the IC package 100 of FIG. 1 in the direction of the inactive side 114, such that the electronic substrates 102 and/or semiconducting die 106 are warped into a horizontal or near-horizontal orientation (as shown by the IC package 100a of FIG. 2).

In embodiments, the precise direction and amount of induced warping necessary to achieve the substantially horizontal IC package 100a may depend on a variety of parameters. For example, the material composition as well as the thickness and dimensions (e.g., x/y) of the electronic substrates 102 and/or semiconducting die 106 may affect the necessary direction and degree of induced warping 116 to correct the inherent warping (108, FIG. 1). Similarly, parameters may also be determined for optimal deposition of the corrective layers 112. For example, the corrective layers 112 may include copper or other metallic elements or compounds. In some embodiments, the corrective layers 112 may include ceramic layers, metalloids, amorphous (e.g., glassy) semiconducting materials, or any appropriate combinations thereof. By selecting corrective layers 112 of a particular thickness and depositing the corrective layers to the inactive side 114 at a particular deposition rate (e.g., between 5 Angstroms per second (Å/s) and 120 Å/s), significant corrective deflections of the electronic substrates 102 may be achieved. For example, higher deposition rates of corrective layers 112 primarily comprising copper may be associated with higher residual stresses and therefore higher degrees of induced warping 116. Similarly, the number of corrective layers 112 deposited may be selected with a particular degree of induced warping 116 in mind, as described below.

In some embodiments, determination of the optimal deposition parameters and deposition of the corrective layers 112 may occur during the active layer manufacturing phase of the production process of the IC package 100a. In other embodiments, parameter determination and deposition of the corrective layers 112 may occur during other phases of the production process or based on other types of IC package 100a, e.g., during reflow soldering or in response to warping issues associated with flip-chip packages and thin ball grid arrays.

Figure 3A:
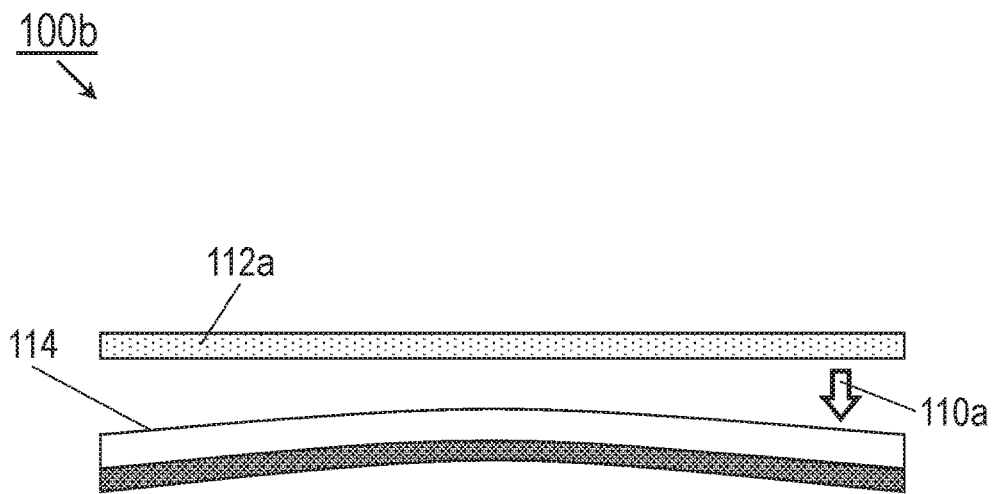
FIGS. 3A through 3C are diagrammatic cross sections illustrating induced warping operations of the IC package of FIG. 1.
Figure 3B:
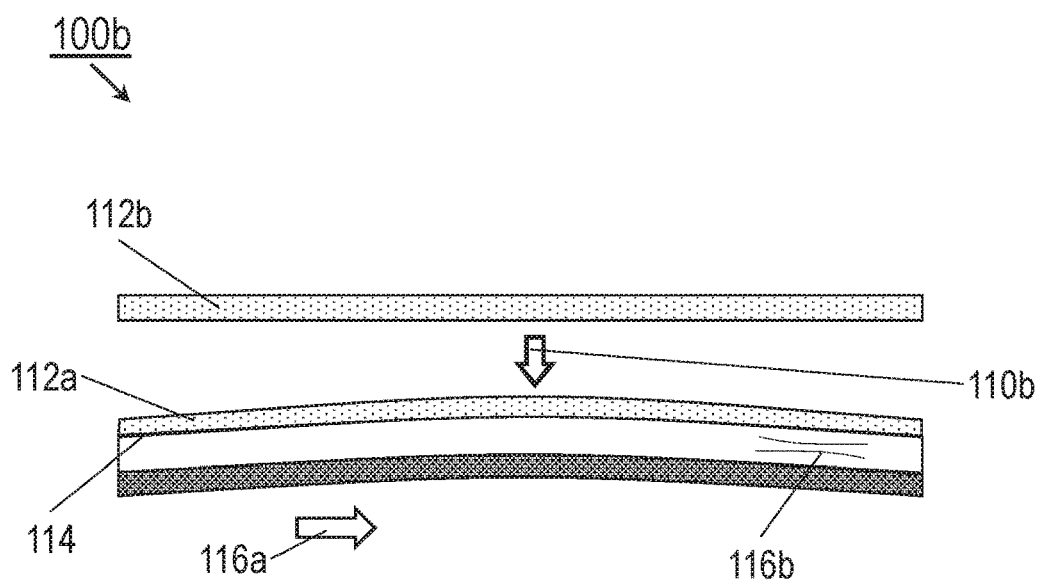
Figure 3C:
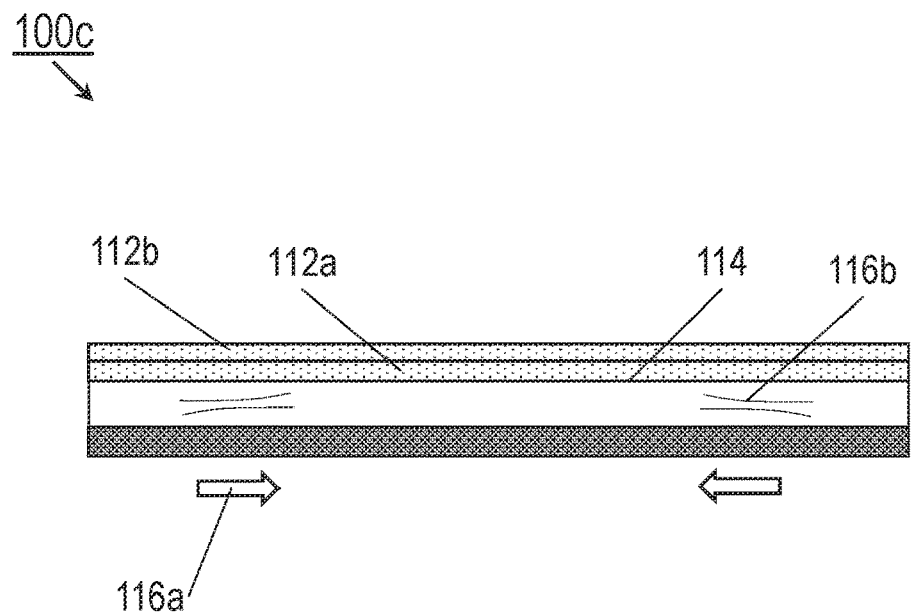

Referring also to FIGS. 3A through 3C, the IC packages 100b-c may be implemented and may function similarly to the IC packages 100, 100a of FIGS. 1 and 2, except that the IC packages 100b-c may incorporate multiple corrective layers 112a-n deposited on the inactive side 114 via TFD (e.g., at lower deposition rates (e.g., 5 Å/s or less) so as to minimize impact stress). For example, referring in particular to FIG. 3A, a first corrective layer 112a may be bonded (110a) to the inactive side 114 of the IC package 100b at a particular deposition rate. Referring in particular to FIG. 3B, a second corrective layer 112b may be deposited upon (110b) or bonded to the first corrective layer 112a, inducing a further warping 116a-b of the IC package 100b. Referring in particular to FIG. 3C, the continued deposition of multiple corrective layers 112a-n may provide, through each successive corrective layer, additional induced warping (116a-b) toward the inactive layer 114 such that the inherent warping (108, FIG. 1) of the IC package 100b may be reduced or even reversed, resulting in the substantially horizontal IC package 100c shown by FIG. 3C.

Figure 4:
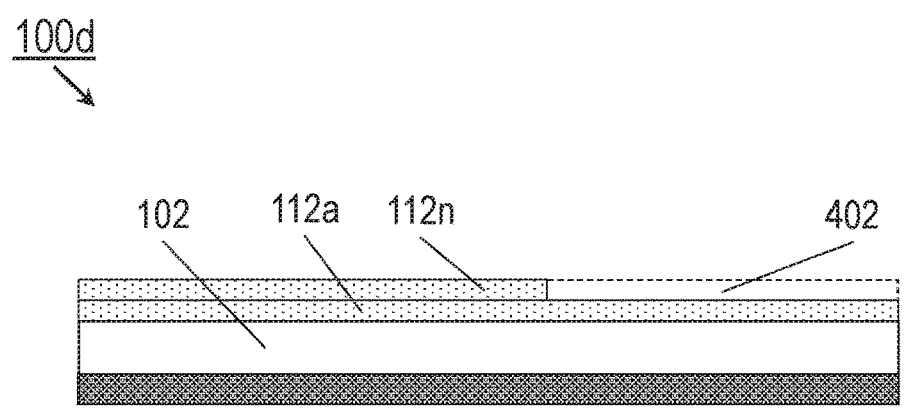
FIG. 4 is a diagrammatic cross section illustrating operations on the IC package of FIG. 1.

Referring to FIG. 4, the IC package 100d may be implemented and may function similarly to the IC packages 100, 100a-c of FIGS. 1 through 3C, except that one or more corrective layers 112a-n may be removable layers configured for temporary induced warping. For example, an outer corrective layer 112n may be partially or fully removed (402) from the electronic substrate 102, fully or partially relieving the corresponding internal compressive and tensile stresses and thereby relieving the corresponding induced warping (116a-b, FIGS. 3B-C).

Figure 5:
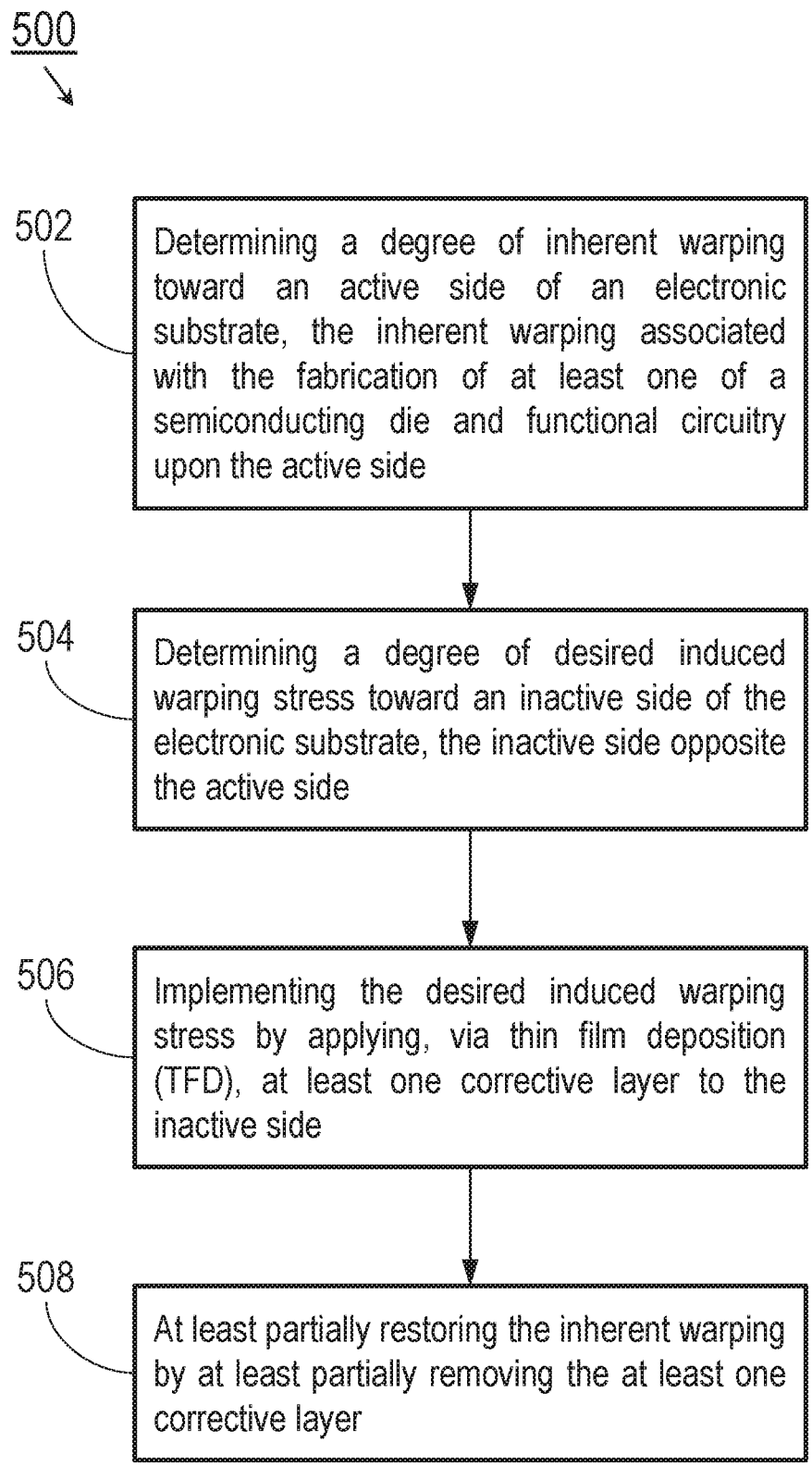
FIG. 5 is a flow diagram illustrating a method for induced warping of an IC package in accordance with example embodiments of this disclosure.

Referring to FIG. 5, the method 500 for induced warping of an integrated circuit (IC) package may be implemented with respect to the IC packages 100, 100-d of FIGS. 1 through 4, and may incorporate the following steps.

At a step 502, the degree of inherent warping toward the active side of an electronic substrate of the IC package due to the fabrication of a semiconducting die and/or functional circuitry on the active side is determined. For example, parameters associated with the semiconducting die or with the electronic substrates may be determined, e.g., the dimensions of the substrate, the thickness of the substrate, or the material composition of the substrate.

At a step 504, a desired degree of induced warping stress toward the inactive side (e.g., opposite the active side) of the electronic substrate is determined. For example, the desired material composition of corrective layers applicable to the inactive side to correctively warp the substrate to the desired degree may be determined, as well as the desired number of layers to be applied (if more than one corrective layer is to be applied).

At a step 506, the desired degree of induced warping stress is implemented by applying at least one corrective layer to the active side via thin film deposition (TFD). For example, the corrective layer/s may be applied at a predetermined deposition rate, or to a predetermined thickness, based on the determined parameters.

The method 500 may include an additional step 508. At the step 508, a portion (partial or full) of the at least one applied corrective layer is partially or fully removed from the inactive side upon which it was deposited to remove the corresponding induced warping stress.

It is to be understood that embodiments of the methods disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

Although inventive concepts have been described with reference to the embodiments illustrated in the attached drawing figures, equivalents may be employed and substitutions made herein without departing from the scope of the claims. Components illustrated and described herein are merely examples of a system/device and components that may be used to implement embodiments of the inventive concepts and may be replaced with other devices and components without departing from the scope of the claims. Furthermore, any dimensions, degrees, and/or numerical ranges provided herein are to be understood as non-limiting examples unless otherwise specified in the claims.

What is claimed is:

1. An integrated circuit (IC) package, comprising:
   at least one semiconducting die;
   an electronic substrate having an active side and an inactive side opposite the active side, at least one of the at least one semiconducting die and functional circuitry fabricated on the active side,
   at least one of the at least one semiconducting die and the electronic substrate associated with an inherent warping toward the active side,
   and
   the inactive side having at least one corrective layer deposited thereupon via thin film deposition (TFD), the at least one corrective layer configured for desired induced warping of the electronic substrate toward the inactive side,
   wherein the desired induced warping includes a temporary induced warping;
   and
   a portion of the at least one corrective layer opposite at least one functional portion of the at least one semiconducting die is at least partially removable in order to partially restore the inherent warping.

2. The IC package of claim 1, wherein the at least one corrective layer is deposited based on at least one predetermined parameter.

3. The IC package of claim 2, wherein the at least one corrective layer has a predetermined thickness based on the at least one predetermined parameter.

4. The IC package of claim 2, wherein the at least one corrective layer is deposited at a predetermined rate based on the at least one predetermined parameter.

5. The IC package of claim 2, wherein the at least one predetermined parameter corresponds to at least one of the at least one semiconducting die, the electronic substrate, or the inherent warping.

6. The IC package of claim 2, wherein the at least one predetermined parameter corresponds to at least one of the at least one corrective layer or the desired induced warping.

7. The IC package of claim 1, wherein the at least one corrective layer is selected from a group including:
   a ceramic layer;
   an amorphous semiconducting layer;
   a metalloid layer;
   or
   a metallic layer.

8. The IC package of claim 1, wherein the IC package includes at least one of a flip-chip assembly and a ball grid array.

9. A method for induced warping of an integrated circuit (IC) package, the method comprising:
   determining a degree of inherent warping toward an active side of an electronic substrate, the inherent warping associated with the fabrication of at least one semiconducting die and functional circuitry upon the active side;
   determining a degree of desired induced warping stress toward an inactive side of the electronic substrate, wherein the inactive side is opposite the active side, and the desired induced warping includes a temporary induced warping;
   implementing the degree of desired induced warping stress by applying, via thin film deposition (TFD), at least one corrective layer to the inactive side;
   and
   at least partially restoring the inherent warping by at least partially removing a portion of the at least one corrective layer opposite a functional portion of the at least one semiconducting die.

10. The method of claim 9, wherein:
    determining a degree of desired induced warping stress toward an inactive side of the electronic substrate, the inactive side opposite the active side, includes:
    determining at least one parameter corresponding to the at least one semiconducting die, the electronic substrate, the degree of inherent warping, or the degree of desired induced warping stress;
    and
    implementing the degree of desired induced warping stress by applying, via thin film deposition (TFD), at least one corrective layer to the inactive side includes:
    applying the at least one corrective layer to the inactive side based on the at least one determined parameter.

11. The method of claim 10, wherein implementing the degree of desired induced warping stress by applying, via thin film deposition (TFD), at least one corrective layer to the inactive side includes:
    applying the at least one corrective layer at a predetermined rate based on the at least one determined parameter.

12. The method of claim 10, wherein implementing the degree of desired induced warping stress by applying, via thin film deposition (TFD), at least one corrective layer to the inactive side includes:
    applying the at least one corrective layer to a predetermined thickness based on the at least one determined parameter.

* * * * *